United States Patent [19]

Hotta et al.

[11] 4,298,961

[45] Nov. 3, 1981

[54] BIPOLAR MEMORY CIRCUIT

[75] Inventors: Atsuo Hotta, Higashiyamato; Yukio Kato, Kodaira, both of Japan

[73] Assignee: Hitachi, Ltd., Tokyo, Japan

[21] Appl. No.: 140,839

[22] Filed: Apr. 16, 1980

[30] Foreign Application Priority Data

Apr. 25, 1979 [JP] Japan ................... 54-50294

[51] Int. Cl.³ ........................................... G11C 11/40
[52] U.S. Cl. .................... 365/179; 365/174; 365/189; 357/24
[58] Field of Search ............... 365/174, 179, 189, 230; 357/24

[56] References Cited

U.S. PATENT DOCUMENTS 3,781,828  12/1973  Platt et al. .................... 365/179

Primary Examiner—Terrell W. Fears
Attorney, Agent, or Firm—Craig and Antonelli

[57] ABSTRACT

An emitter junction type bipolar memory cell circuit having clamp diodes connected in parallel to collector resistances. The collector resistances are set to produce a potential difference of greater than 0.6 V or so caused by the stationary current. By so doing, it is possible to exclude any mal-function attributable to noises in the writing operation of the memory circuit.

3 Claims, 6 Drawing Figures

BIPOLAR MEMORY CIRCUIT

BACKGROUND OF THE INVENTION

The present invention relates to a memory circuit incorporating a pair of bipolar transistors of emitter junction type and, more particularly, to a memory cell circuit using memory cells having non-linear collector loads.

Such a bipolar memory cell circuit of emitter coupled type has been known as having a pair of multi-emitter transistors having collector resistances connected to each collector of the multi-emitter transistors, and a clamp diode connected in parallel to each collector resistance. This type of circuit is shown, for example, in the specification of U.S. Pat. No. 3,537,078.

In the memory circuit having emitter coupled type memory cells, it is required to reduce as much as possible the stationary current non-selectively imparted to the memory cells, in order to reduce the power consumption of the memory circuit as a whole. On the other hand, the collector load resistance imparted to the memory cells is required to be diminished as much as possible, in order to increase the switching speed of the memory cells.

To meet these requirements, in the conventional memory cell circuit, it has been attempted to maintain the difference of output level between a pair of transistors which is imparted by a stationary current in the off-selection period at such a low level as 0.3 volt. The present inventors, however, have found out that this conventional memory circuit poses the following problems.

Referring to FIG. 4, the word line selection signal applied to the memory circuit and the writing pulse are represented by Ai and WE, respectively. Then, the delay time of the writing pulse WE is represented as set-up time $T_{WSA}$, whereas the pulse width of the writing pulse WE is represented as writing time $t_W$. The present inventors have found out that there is a relationship as shown in FIG. 3 between the writing time $t_W$ and set-up time $t_{WSA}$.

More specifically, in FIG. 3, the curve A shows the characteristic of the writing time $t_W$ which permits a writing in any one of the memory cells arranged in a matrix-like form, while the curve B shows the characteristic of the writing time $t_W$ which makes it impossible to write in any one of the memory cells. The area $S_B$ defined by the curve B represents the region in which the writing is impossible. The writing time $t_W$ of the writing pulse determined by the characteristic curve B is the Not Write Pulse Width. The area Sc defined by the curves A and B represents the region in which a part of the memory cells is operative for the writing.

In order to write informations in any selected memory circuit, the writing time $t_W$ of writing pulse WE is determined to be longer than the time determined by the characteristic curve A.

In the known memory circuit, however, there is a problem that the Not Write Pulse width is about 0 ns in the set-up time $t_{WSA}$ around the rise of the word line signal Ai, as will be understood from the characteristic curve B of FIG. 3. The fact that the Not Write pulse width is 0 ns means that an erroneous writing is made in the memory circuit by a high-frequency noise N in the writing pulse having a peak value reaching the logic threshold voltage.

SUMMARY OF THE INVENTION

It is, therefore, an object of the invention to provide a bipolar memory circuit having an improved anti-noise characteristic.

To this end, according to the invention, there is provided an emitter coupled type bipolar memory cell having a pair of multi-emitter transistors the bases and collectors of which are cross-coupled, characterized in that clamp diodes are connected in parallel to the collector resistances and that the difference of output level between the pair of transistors is set to be greater than 0.6 volt.

DESCRIPTION OF THE PREFERRED EMBODIMENT

The invention will be described hereinafter with reference to the accompanying drawings.

Figure 1:
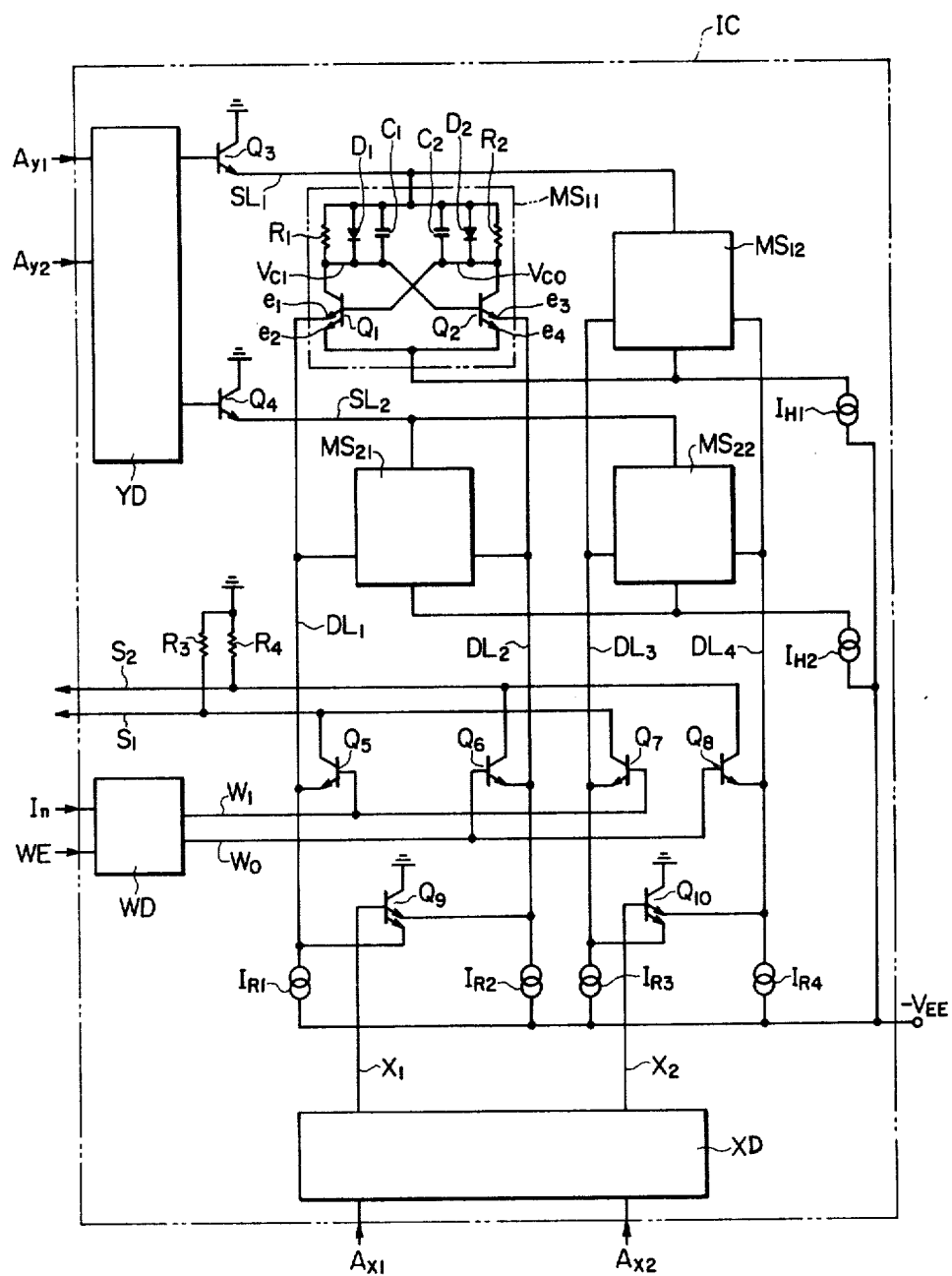
FIG. 1 is a circuit diagram of a circuit embodying the present invention.

Referring first to FIG. 1 showing a circuit constructed in accordance with an embodiment of the invention, a plurality of memory cells $MS_{11}$, $MS_{12}$, $MS_{21}$, $MS_{22}$ . . . are arranged in the matrix-like manner. As shown exemplarily by $MS_{11}$, each memory cell includes a pair of multi-emitter transistors $Q_1$, $Q_2$ cross-coupled to each other. One of the emitters of each transistor is used as the output and input terminals. A pair of transistors $Q_5$, $Q_6$ adapted to be used for reading and writing are emitter-coupled to the transistors $Q_1$, $Q_2$. The construction of this memory cell will be described later. The emitters of the pair of multi-emitter transistors of each memory cell are connected commonly to a pair of digit lines DL1 and DL2 to which emitter-coupled are the pair of transistors $Q_5$ and $Q_6$ for reading and writing. Also, a multi-emitter transistor $Q_9$ for the selection of the digit line (x selection) is emitter-coupled to the pair of digit lines.

The non-selective stationary current of each memory cell is determined by means of a constant current circuit $I_{H1}$ and $I_{H2}$. For instance, this constant current circuit limits the stationary current in a memory cell out of selection to an extremely small level of 6 $\mu$A or so. On the other hand, constant current circuits $I_{R1}$, $I_{R2}$, $I_{R3}$, $I_{R4}$ . . . which are used in reading and writing are connected to each digit line, so that the reading or writing current flowing through the emitter of multi-emitter transistor when selected is limited to a value which is much greater than the above-described stationary current, e.g. to 0.3 to 2 mA.

Each memory cell is connected to the word lines $SL_1$, $SL_2$ . . . .

Although only 4 (four) memory cells are shown, a multiplicity of memory cells, e.g. 64 × 64 memory cells are arrayed in the form of matrix to constitute a memory array.

Symbol YD represents the Y address decoder for selecting the word line, and is adapted to form Y address selection signal for selecting one of the plurality of word lines of the above-stated memory array, upon receipt of a plurality of bits (for example 6 inputs) of address signals $A_{y1}$ to $A_{y2}$.

Transistors $Q_3$, $Q_4$ act as word driver and is adapted to make the selection of the word line upon receipt of the output from the Y-address decoder 2.

An X address decoder XD is adapted to form an X address selection signal for selecting one of the plurality of digit lines of the above-mentioned memory array, upon receipt of a plurality of bits (e.g. 6 inputs) of address signals $A_{X1}$ to $A_{X2}$.

A writing control circuit WD produces a writing signal of a predetermined level on one of the output lines $W_0$ and $W_1$ in accordance with the input information signal In, upon receipt of the input information signal $I_n$ and writing pulse WE.

$V_{EE}$ represents a source terminal to which applied is a voltage of, for example, $-5.2$ V.

In the circuit described above, the portion enclosed by the one-dot-and-dash line is formed as an integrated circuit formed by the integrated circuit technic on a common silicon semiconductor substrate.

The selection and non-selection of the memory cell and the reading and writing during selection of $M_{S11}$ are determined in accordance with the current switching operation of the memory cell transistors commonly connected to the digit, reading and writing transistors $Q_5$, $Q_6$ and the selection transistor $Q_9$.

More specifically, the word line which is not selected is maintained at a comparatively low potential (referred to as $V_L$ hereinafter, $-2.0$ V for example), whereas the selected word line is maintained at a comparatively high potential (referred to as $V_H$ hereinafter, $-1.0$ V for example), so that the lower one of the collector voltages of two transistors $Q_1$, $Q_2$ of the memory cell connected to the selected word line is higher than the higher one of the collector voltages of two transistors $Q_1$, $Q_2$ of the memory cell connected to the non-selected word line.

The potential (referred to as $V_{XH}$) of the X address selection line out of selection is selected to be slightly higher than the above-mentioned potential $V_H$, while the potential (referred to as $V_{XL}$) of the Y address selection line of selection is maintained at a level lower than the lower one of the collector voltages of two transistors $Q_1$, $Q_2$ in the memory cell connected to the selected word line.

The writing lines $W_1$, $W_0$ are maintained at a reference voltage (referred to as $V_R$, $-1.4$ V for example) which is intermediate between the collector voltage of the transistor Q1 and the collector voltage of the transistor Q2 of the memory cell connected to the word line of selection. One of these two writing lines selected in accordance with the information to be written is maintained at a potential (referred to as $V_{WL}$, $-1.9$ V for example) below two collector voltages, whereas the other is maintained substantially at the above-mentioned reference voltage $V_R$.

For instance, in case that the selection line $X_1$ of the X address is in the state out of selection, the transistor $Q_9$ is turned on by the high potential of the address selection line $X_1$, so that the transistor $Q_9$ permits the current supply to the constant current means $IR_1$, $IR_2$. Therefore, the emitters $e_1$, $e_3$ connected to the digit lines $DL_1$, $DL_2$ in memory cells $MS_{11}$, $MS_{21}$ are kept in off state. Also, the transistors $Q_5$, $Q_6$ for reading and writing are kept in off state. In this case, stationary current means $I_{H1}$, $I_{H2}$ supply stationary current for holding the information to the memory cells $MS_{11}$, $MS_{21}$.

The memory cell $MS_{11}$ is selected by the word line $SL_1$ and X address selection line $X_1$. In this case, the selection transistor $Q_9$ is kept in the off state by the base voltages of the transistors emitter-coupled to the digit lines $DL_1$, $DL_2$.

Although not exclusive, the memorized information "1" in the memory cell corresponds to the on state of the transistor $Q_1$ and to off state of the transistor $Q_2$, whereas "0" corresponds to the off state of the transistor $Q_1$ and the on state of the transistor $Q_2$.

In the reading, if the information of the selected memory cell $MS_{11}$ is "1", the base potential of the transistor $Q_1$ of the memory cell $MS_{11}$ is greater than the base voltage $V_R$ of the transistor $Q_5$, so that electric current flows from the emitter $e_1$ of the above-mentioned transistor $Q_1$ to the constant current means $I_{R1}$. In contrast to the above, the base potential of the transistor $Q_2$ is lower than the base voltage $V_R$ of the transistor $Q_6$ so that electric current flows from the latter to the constant current means $I_{R2}$. This electric current causes a voltage drop across a load resistance $R_4$ connected to the sense line $S_2$. Namely, the sense line $S_1$ is maintained at a high level, while the sense line $S_2$ is maintained at a low level, in accordance with the memorized information in the selected memory cell $MS_{11}$.

In the writing, the writing line $W_1$ is kept at a low potential $V_{WL}$, while the writing line $W_0$ is maintained at the reference voltage $V_R$. In this case, by the current switching operation of the transistor $Q_1$ and $Q_5$, electric current is supplied from the emitter $e_1$ of the transistor $Q_1$ to the constant current means $I_{R1}$, irrespective of whether the transistor $Q_1$ of the memory cell $MS_{11}$ takes on or off state. In consequence, the transistor $Q_1$ is turned on, so that "1" as the information is written in the memory cell $MS_{11}$.

The memory cell of the memory circuit of the invention has a pair of clamping diodes $D_1$, $D_2$ connected in parallel to the pair of collector load resistances $R_1$, $R_2$. Further, a capacitor C1 and a capacitor C2 are connected in parallel to the diode $D_1$ and diode $D_2$, respectively. The diodes $D_1$, $D_2$ are formed materially by a PN junction of silicon.

Figure 5:
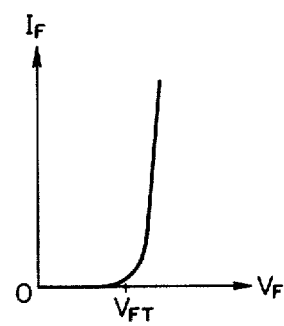
FIG. 5 shows the characteristic of the clamp diode as used in the circuit of the invention.

When out of selection, the voltage drop across the collector load resistance caused by the collector current flowing through one conductive transistor of the memory cell is set to be able to turn on the clamp diode. Namely, the collector load resistances $R_1$, $R_2$ of the memory cell are selected to be high enough to bias the diode in the forward direction to a voltage higher than the voltage $V_{FT}$ at which the diode becomes conductive in the forward current characteristic shown in FIG. 5, i.e. to a voltage higher than the threshold voltage which is 0.6 V, thereby to cause a voltage drop of higher than 0.6 V across the load resistance. For instance, if the setting is made such that the stationary current in the on transistor (e.g. $Q_2$) of the memory cell out of selection is 6 μA, the collector load resistance $R_1$, $R_2$ is set at about 100 KΩ. In other example, the collector load resistance can be set at a level falling within the range between 10 KΩ and 100 KΩ, depending on the level of the stationary current.

Thus, according to the invention, in order to obtain a large collector voltage drop in the memory cell with a small stationary current, the values of the collector resistances $R_1$, $R_2$ are selected sufficiently large to produce a voltage higher than 0.6 V, e.g. 0.8 V which corresponds to the clamp voltage. Namely, in the present invention, the difference between the collector voltages between the on transistor ($Q_2$) and the off transistor ($Q_1$) is selected to be greater than 0.6 V.

Needless to say, in the selected state, the current for reading and writing is given by the constant current circuit $I_{R1}$, $I_{R2}$ which can impart a large current, so that the collector voltages in the memory cell are clamped at the predetermined level by the action of the clamp diodes $D_1$, $D_2$. Due to the presence of the clamp diodes, the difference of level between the selected state and non-selected state is limited by the threshold voltage (about 0.8 V) of the diode.

It is, therefore, meaningless to set the voltage drop caused by the collector resistance and the stationary current at a level greater than the above-mentioned clamp voltage. In order to minimize the consumption of current, it is preferred to set the voltage at a level which is achieved immediately before the turning on of the clamp diode.

According to the invention, the difference between collector voltages in the memory cell caused by the stationary current, i.e. the holding level in the state out of selection, is selected to be large, for the reason as stated below. The inventors have found that the reduction of the Not Write Pulse width to 0 (zero) ns is attributable to the low holding level.

Figure 2:
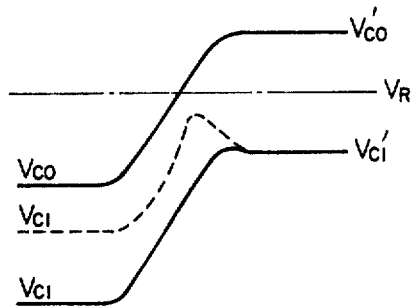
FIG. 2 is an illustration for explaining the operation of the circuit of the invention.

As shown in FIG. 2 by broken line, the collector voltage $V_{c1}$ of the on transistor $Q_2$ is about 0.3 V which is lower than the collector voltage $V_{co}$ of the off transistor in the conventional circuit. Therefore, in the rise of the word line SL, a peak is generated in the on transistor of the collector voltage $V_{c1}$ with respect to the reference voltage $V_R$, so that the difference is reduced to permit an easy inversion by a high-frequency noise.

To avoid this, according to the invention, the resistances $R_1$, $R_2$ of the collectors of the memory cell are selected to be large, and the collector voltage $V_{c1}$ of the on transistor is lowered considerably to realize a large potential difference in excess of 0.6 V between the collector voltages $V_{co}$ and $V_{c1}$, as shown by full line in FIG. 2. By so doing, it is possible to obtain a large level difference in the rise of the word line SL, so that the digit lines $DL_1$, $DL_2$ become less sensitive to the noises.

It is true that the access time is reduced by the increased values of the collector resistances $R_1$, $R_2$. The high-speed operation of the circuit, however, is never failed, because the reduction of the speed can be avoided by an insertion of speed-up capacitors $C_1$, $C_2$. Thus, in the circuit of this embodiment, the anti-noise characteristic can be improved by increasing the collector resistances, without paying specific attention to the access time.

Figure 3:
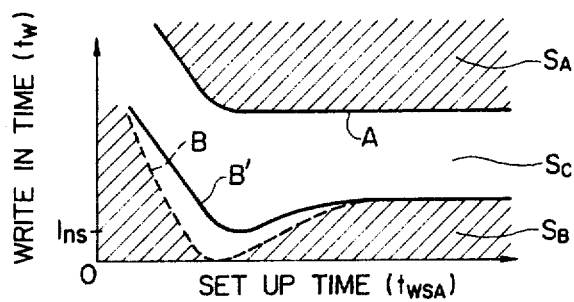
FIG. 3 shows a relationship between the set-up time and the writing time.
Figure 4:
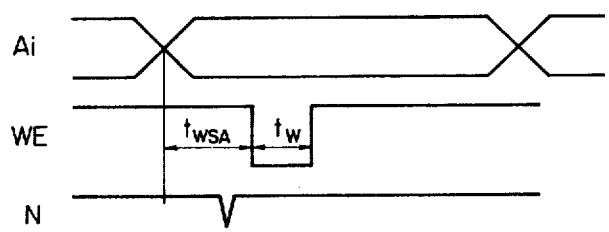
FIG. 4 shows the waveform of access signal of a memory circuit.

When the holding level in the state out of selection is set at a high level of 0.8 V as in the circuit of this embodiment, the minimum value of the Not Write Pulse width is as large as about 1 ns, as shown by full line B' in FIG. 3. This means that the anti-noise characteristic has been improved considerably.

Although the invention has been described through its preferred form, the described embodiment is not exclusive, and various changes and modifications may be imparted thereto.

Figure 6:
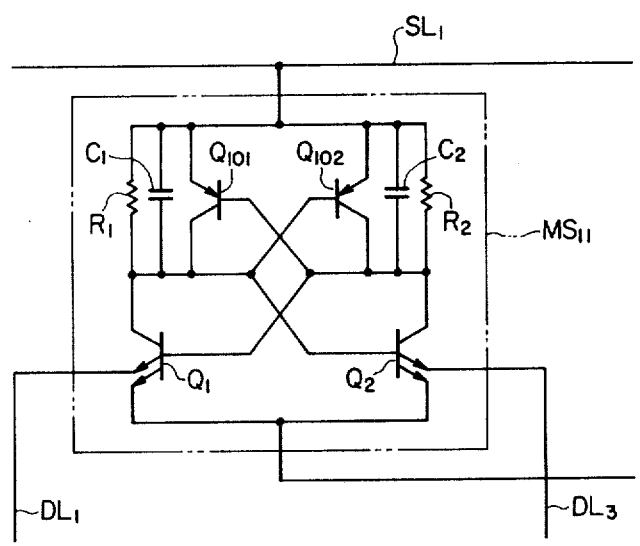
FIG. 6 is a circuit diagram showing a memory cell constructed in accordance with another embodiment of the invention.

For instance, the diode means may be constituted by making use of the emitter-base connection of PNP transistors $Q_{101}$, $Q_{102}$ as shown in FIG. 6.

In the bipolar memory circuit, however, it is essential that the Not Write Pulse width is greater than 1 ns at the shortest, in order to obtain a sufficient anti-noise characteristic. To this end, it is necessary that the above-mentioned difference of level be at least 0.6 V.

What is claimed is:

1. A memory circuit comprising: a matrix of memory cells arranged in rows and columns, each cell having a pair of multi-emitter transistors each of which having two emitters, collector and a base, the bases and collectors of said pair of multi-emitter transistors being cross-coupled to each other, one emitters of said pair of transistors being commonly connected to a stationary current source for providing a stationary current, whereas the other emitters of said pair of transistors being respectively connected to a pair of column lines, said collectors of said pair of transistors being connected to a row line through parallel circuits of a load resistance and a diode means, respectively; a pair of writing transistors being connected at their emitters to said pair of column lines respectively; and writing current source means connected to said pair of column lines for delivering a writing current; wherein, in the stationary state out of selection, the difference of collector voltages between said pair of multi-emitter transistors caused by the stationary current is set at a level higher than 0.6 V.

2. A memory circuit as claimed in claim 1, wherein, in the stationary state, the potential drop generated by said stationary current across said load resistance of the conductive multi-emitter transistor in said memory cell is produced by applying a bias of higher than 0.6 V to the diode connected in parallel to said load resistance in the forward direction of said diode.

3. A memory circuit as claimed in claim 2, wherein said memory cell include capacitors connected to respective load resistances.

* * * * *